_(12)_ United States Patent
Iwasaki et al.

(10) Patent No.: US 11,282,567 B2
(45) Date of Patent: Mar. 22, 2022

(54) SEQUENTIAL SLC READ OPTIMIZATION

(71) Applicant: Micron Technology, Inc., Boise, ID (US)

(72) Inventors: Tomoko Ogura Iwasaki, San Jose, CA (US); Tracy D. Evans, Boise, ID (US); Avani F. Trivedi, Eagle, ID (US); Aparna U. Limaye, Boise, ID (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/947,795

(22) Filed: Aug. 17, 2020

(65) Prior Publication Data

US 2021/0057018 A1     Feb. 25, 2021

Related U.S. Application Data

(60) Provisional application No. 62/889,240, filed on Aug. 20, 2019.

(51) Int. Cl.
*G11C 11/408* (2006.01)
*G06F 12/02* (2006.01)
*G11C 11/4074* (2006.01)

(52) U.S. Cl.
CPC ...... *G11C 11/4087* (2013.01); *G06F 12/0246* (2013.01); *G11C 11/4074* (2013.01); *G11C 11/4085* (2013.01); *G06F 2212/7201* (2013.01)

(58) Field of Classification Search
CPC ........... G11C 11/4087; G11C 11/4085; G11C 11/4074; G11C 11/5642; G11C 16/26; G06F 12/0246; G06F 2212/7201

(Continued)

(56) References Cited

U.S. PATENT DOCUMENTS 7,688,614 B2    3/2010  Morimoto
9,514,057 B2   12/2016  Marcu et al.
(Continued)

FOREIGN PATENT DOCUMENTS

JP    2010244342 A    10/2010
KR   20090053901 A     5/2009
(Continued)

OTHER PUBLICATIONS

International Search Report and Written Opinion for International Application No. PCT/US2020/047075, dated Nov. 20, 2020, 10 pages.

(Continued)

*Primary Examiner* — Fernando Hidalgo
(74) *Attorney, Agent, or Firm* — Lowenstein Sandler LLP

(57) ABSTRACT

Systems and methods for read operations and management are disclosed. More specifically, this disclosure is directed to receiving a first read command directed to a first logical address and receiving, after the first read command, a second read command directed to a second logic address. The method also includes receiving, after the second read command, a third read command directed to a third logical address and determining that the first logical address and the third logical address correspond to a first physical address and a third physical address, respectively. The first physical address and the third physical address can be associated with a first word line of a memory component while the second logical address corresponds to a second physical address associated with a second word line of the memory component. The method includes executing the first read command and the third read command sequentially.

20 Claims, 5 Drawing Sheets

(58) Field of Classification Search
USPC .................................................. 365/185.23
See application file for complete search history.

(56) References Cited

U.S. PATENT DOCUMENTS

| | | | |
|---|---|---|---|
| 10,761,728 B2 | 9/2020 | Hong et al. | |
| 10,853,243 B2 | 12/2020 | Davis | |
| 2005/0144357 A1 | 6/2005 | Sinclair | |
| 2007/0174579 A1 | 7/2007 | Shin | |
| 2007/0237003 A1 | 10/2007 | Melik-Martirosian et al. | |
| 2009/0073771 A1 | 3/2009 | Li | |
| 2009/0319720 A1 | 12/2009 | Stefanus et al. | |
| 2013/0046920 A1 | 2/2013 | Ryu et al. | |
| 2013/0055047 A1 | 2/2013 | Sharon et al. | |
| 2014/0032817 A1 | 1/2014 | Bux et al. | |
| 2014/0204672 A1 | 7/2014 | Lee et al. | |
| 2015/0154118 A1* | 6/2015 | Marcu | G06F 12/1009 711/206 |
| 2015/0205539 A1 | 7/2015 | Moon et al. | |
| 2016/0011971 A1 | 1/2016 | Lee et al. | |
| 2016/0026526 A1 | 1/2016 | Zhang et al. | |
| 2016/0092128 A1 | 3/2016 | Jain et al. | |
| 2016/0179386 A1 | 6/2016 | Zhang | |
| 2017/0046256 A1 | 2/2017 | Horspool et al. | |
| 2018/0024779 A1 | 1/2018 | Kojima | |
| 2018/0059934 A1 | 3/2018 | Lee et al. | |
| 2018/0189175 A1 | 7/2018 | Ji et al. | |
| 2018/0314579 A1 | 11/2018 | Sampayo et al. | |
| 2019/0095323 A1 | 3/2019 | Gidra et al. | |
| 2020/0110537 A1 | 4/2020 | Hahn et al. | |
| 2020/0110706 A1* | 4/2020 | Takeuchi | G06F 11/1068 |

FOREIGN PATENT DOCUMENTS

| | | |
|---|---|---|
| KR | 10-2010-0122720 A | 11/2010 |
| KR | 10-2014-0116617 A | 10/2014 |

OTHER PUBLICATIONS

International Search Report and Written Opinion for International Application No. PCT/US2020/048393, dated Nov. 25, 2020, 10 pages.
International Search Report and Written Opinion for International Application No. PCT/US2020/047260, dated Nov. 25, 2020, 10 pages.
International Search Report and Written Opinion for International Application No. PCT/US2020/047074 dated Nov. 20, 2020, 9 pages.
International Search Report and Written Opinion for International Application No. PCT/US2020/047263 dated Nov. 20, 2020, 11 pages.

* cited by examiner

SEQUENTIAL SLC READ OPTIMIZATION

RELATED APPLICATIONS

This application claims the benefit of U.S. Provisional Application No. 62/889,240, filed Aug. 20, 2019, the entire contents or which are hereby incorporated by reference herein.

TECHNICAL FIELD

Embodiments of the disclosure relate generally to memory sub-systems, and more specifically, relate to sequential SLC read optimization.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
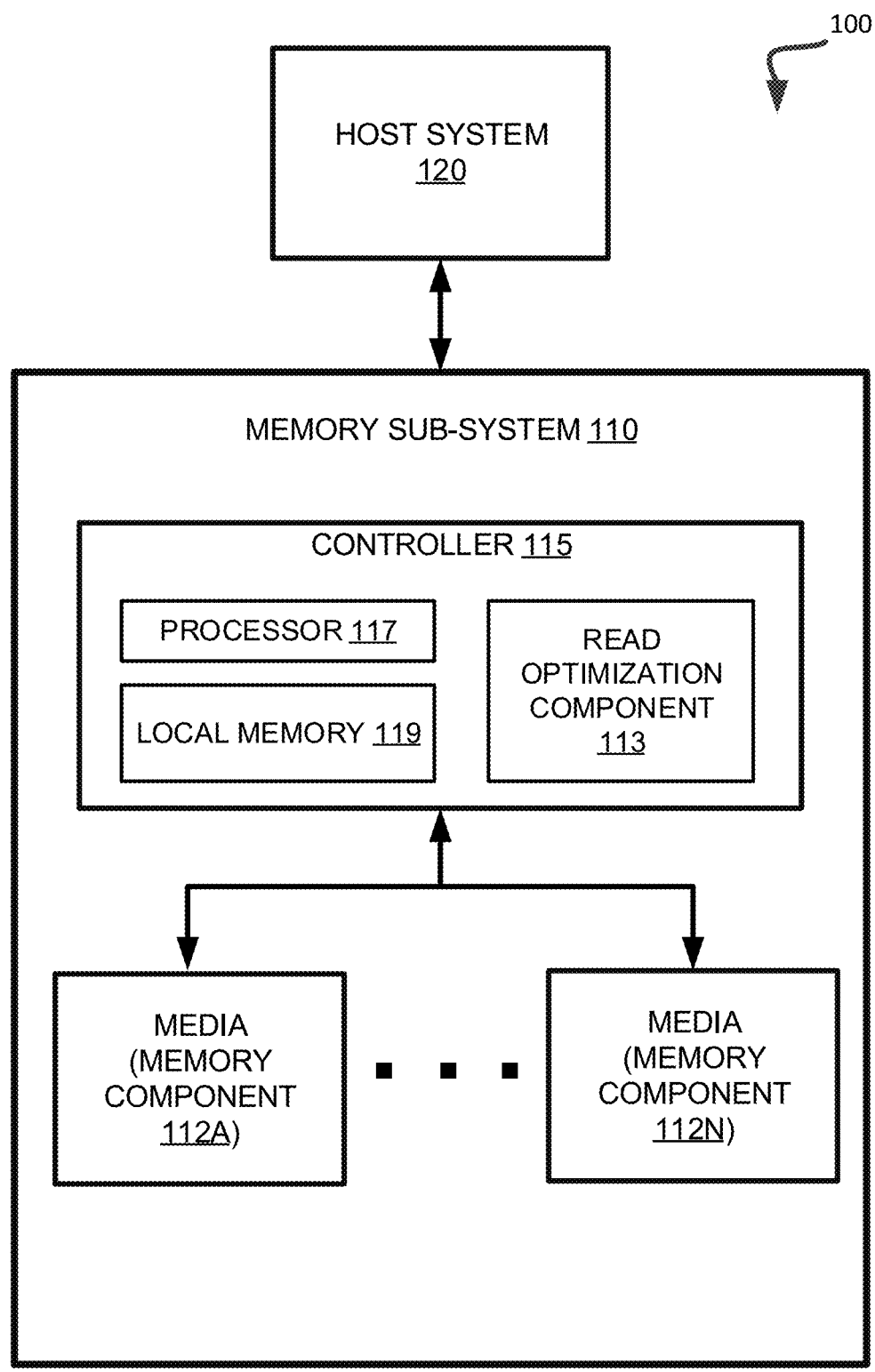
FIG. 1 illustrates an example computing environment that includes a memory sub-system in accordance with some embodiments of the present disclosure.

Aspects of the present disclosure are directed to managing a memory sub-system and optimizing read operations executed in that memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

The memory sub-system can include multiple memory components that can store data. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory. The characteristics of different types of media can be different from one media type to another media type. One example of a characteristic associated with a memory component is data density. Data density corresponds to an amount of data (e.g., bits of data) that can be stored per memory cell of a memory component. Using the example of a flash based memory, a quad-level cell (QLC) can store four bits of data while a single-level cell (SLC) can store one bit of data. Accordingly, a memory component including QLC memory cells will have a higher data density than a memory component including SLC memory cells. Another example of a characteristic of a memory component is access speed. The access speed corresponds to an amount of time for the memory component to access data stored at the memory component. The methods and systems of this disclosure can be implemented in SLC, TLC, and QLC memory.

The memory cell is the fundamental building block of computer memory. The memory cell is an electronic circuit that stores one bit of binary information and it is set to store a logic 1 (high voltage level) and reset to store a logic 0 (low voltage level). Its value can be maintained/stored until it is changed by the set/reset process. The value in the memory cell can be accessed by reading it. Memory cells can be etched onto a silicon wafer in an array of columns (bit lines) and rows (word lines). The intersection of a bit line and word line can constitute the address of the memory cell.

Memory cells can have a support infrastructure of specialized circuits. These circuits can perform functions such as: identifying each row and column (row address select and column address select); keeping track of the refresh sequence (counter); reading and restoring the signal from a cell (sense amplifier); and telling a cell whether it should take a charge or not (write enable). Other functions of a memory controller include a series of tasks that include identifying the type, speed and amount of memory, and checking for errors.

A conventional memory sub-system includes memory components that contain data to be read. Data can be read for multiple reasons, including software implementation, host system functionality, data compaction, garbage collection, etc. Typically, the controller executes the read commands sequentially in the order in which they are received. That is, if the controller receives a first read command, then a second read command, and finally a third read command, the controller will first execute the first read command, then the second read command, then the third read command, respectively.

However, sequential execution of read commands can consume excessive power, time, and resources. In order to read a data value from a physical address, a controller typically performs an unselected word line setup, a selected word line setup, and reads the data at the physical address. The controller typically performs this process to read the data at each physical address. Often times the controller has to read data values from physical addresses that share word lines yet are not sequential in the read command queue. Traditionally, a controller executes read commands in the order they are received by the controller. For example, if the controller receives read command 1 for a first memory address, then read command 2 for a second memory address, and then read command 3 for a third memory address, the controller will execute read command 1, then read command 2, and lastly read command 3. In other words, the controller executes the read commands on a first-come, first-served sequence. The controller does not take the physical addresses of the memory cells being read into account. In order to execute a read command, the controller performs a selected word line setup and an unselected word line setup. As such, the controller performs a first selected word line setup and an unselected word line setup to read the first memory address, a second selected word line setup and an unselected word line setup to read the second memory address, and a third selected word line setup and an unselected word line setup to read the third memory address. However in some cases, the first memory address and the third memory address can be read using the same selected word line setup and unselected word line setup because the first memory address and the third memory address are associated with the same physical word line. But because the controller does not take the physical address of the memory cells into account when executing the read commands, the controller is not able to take advantage of reading the data from the two memory addresses by using the same selected word line setup and unselected word line setup.

The present disclosure is directed to reordering the read command sequence in order to take advantage of memory addresses that can be read together due to a shared physical property (e.g., word line). In the above example, embodiments of the disclosure can reorder the read command sequence such that the controller performs a first unselected word line setup and an selected word line setup to read the first memory address and the third memory address, and a second unselected word line setup and an selected word line setup to read the second memory address. Accordingly, the controller can reorder the execution of read commands such that the read commands directed to physical addresses that share a physical property (e.g., a shared word line or bit line) are executed sequentially even if the controller does not receive the read commands from the host system sequentially. Accordingly, the number of unselected word line setups and selected word line setups needed to execute a batch/sequence of read commands is reduced. The reduction in unselected word line setups and selected word line setups reduces costs by lowering the amount of time and resources needed to execute unselected word line setups and selected word line setups.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a read optimization component 113 that can be used to optimize reading of data in memory components 112A, 112N. In some embodiments, the controller 115 includes at least a portion of the read optimization component 113. For example, the controller 115 can include a processor 117 (processing device) configured to execute instructions stored in local memory 119 for performing the operations described herein. In some embodiments, the read optimization component 113 is part of the host system 120, an application, or an operating system.

The read optimization component 113 can reorder read commands to allow for a more efficient use of resources. In one example, a program running in the host system 120 can specify or determine a first logical memory address, a second logical memory address, and a third logical memory address. The first logical memory address, the second logical memory address, and the third logical memory address can be determined by a central processing unit (CPU) of the host system 120. A logical address is a virtual address as it does not exist physically. This logical address is used as a reference to access the physical address in memory components 112A-112N by the CPU. A hardware device called a memory-management unit (MMU) can map the logical address to its corresponding physical address. The physical address identifies a physical location of data in the memory components 112A to 112N. The host system 120 can access the physical address by using its corresponding logical address. A relocation register can be used to map the logical address to the physical address in various ways. In some examples, when the CPU generates a logical address (e.g., 345), the MMU can generate a relocation register (e.g., 300) that is added to the logical address to identify the location of the physical address (e.g., 345+300=645).

In order to obtain the data stored in the first logical memory address, the second logical memory address, and the third logical memory address, the host system 120 can send the controller 115 a series of read commands: read command 1 for the first logical memory address, then read command 2 for the second logical memory address, and lastly read command 3 for the third logical memory address, wherein read command 1 is received by the controller 115 first in time, read command 2 is received by the controller 115 second in time, and read command 3 is received by the controller third in time. The read optimization component 113, using the MMU, can then identify a first physical memory address associated with the first logical memory address, a second physical memory address associated with the second logical memory address, and a third physical memory address associated with the third logical memory address.

The precise location of the first physical address, the second physical address and the third physical address can be determined by the design of the memory components 112A to 112N. In memory components 112A to 112N, there can be a series of bit lines that run in a first direction down the memory components 112A to 112N. Each bit line can define a subblock of memory of the memory components 112A to 112N. Memory components 112A to 112N can also have a series of word lines that run in a second direction across the subblocks. The intersection of each word line and each bit line can be identified as a memory address. Thus, the controller 115 can identify the location of a physical memory address by identifying its word line and bit line intersection. In order to read the data at a physical memory address, the controller 115 can perform an unselected word line setup on all the word lines not associated with the physical memory address and a selected word line setup on the word line intersecting the subblock of physical the memory address. The unselected word line setup can include applying a first voltage across the unselected word lines and the selected word line setup can include applying another given voltage across the selected word line. After performing the unselected word line setups and selected word line setups, the controller 115 can read the data value from the subblock and send the data value to the host system 120.

The controller 115 can perform the following sequence in order to read the data at the first physical address, the second physical address, and the third physical address. In order to read the data located in the first physical address associated with the first logical memory address, the controller 115 can perform the unselected word line setup on the unselected word lines and the selected word line setup on the word line associated with the first physical address. Then, in order to read the data located in the second physical address associated with the second logical memory address, the controller 115 can perform the unselected word line setup on the unselected word lines and the selected word line setup on the word line associated with the second physical address. Lastly, in order to read the data located in the third physical address associated with the third logical memory address, the controller 115 can perform the unselected word line setup on the unselected word lines and the selected word line setup on the word line associated with the third physical address.

A progression of unselected word line setups and selected word line setups, as demonstrated above, can be called a sequence. The above progression of unselected word line setups and selected word line setups can be called a sequential setup sequence because the controller 115 performs the sequences on a first-come, first-served basis based on when the read commands are received. If the controller were to read the data in the first physical address, the second physical address, and the third physical address according to the above sequential setup sequence, the controller 115 would perform a total of three unselected word line setups and three selected word line setups.

Traditionally, the controller 115 would read the first physical address, the second physical address, and the third physical address without regard to any physical associations between the addresses. However, the read optimization component 113 can identify that the first physical address associated with the first memory address and the third physical address associated with the third memory address are associated with the same physical location (e.g., word line, bit line, etc.). In this example, the first physical address associated with the first logical memory address and the third physical address associated with the third logical memory address share a word line.

In order to reduce the amount of unselected word line setups and selected word line setups, the read optimization component 113 can reorder the sequence in which the first physical address, the second physical address, and the third physical address are read by the controller 115, such that when the controller 115 performs the unselected word line setup and selected word line setup for the first physical address, the controller 115 reads both the data at the first physical address and the third physical address. The controller 115 can then perform an unselected word line setup and selected word line setup to read the data at the second physical address. Alternatively, the controller 115 can read the data at the second physical address, first physical address, and third physical address. Other read sequences are also possible (e.g., third physical address, first physical address, second physical address; and second physical address, third physical address, first physical address). Thus, in order to read the data at the three physical addresses, the read optimization component 113 can instruct the controller 115 to perform a total of two unselected word line setups and two selected word line setups. In this example, the read optimization component 113 can save the controller 115 from performing two word line setups. The cumulative reduction in unselected word line setups and selected word line setups reduces costs by lowering the amount of time and resources needed to execute read commands.

Figures 2A, 2B:
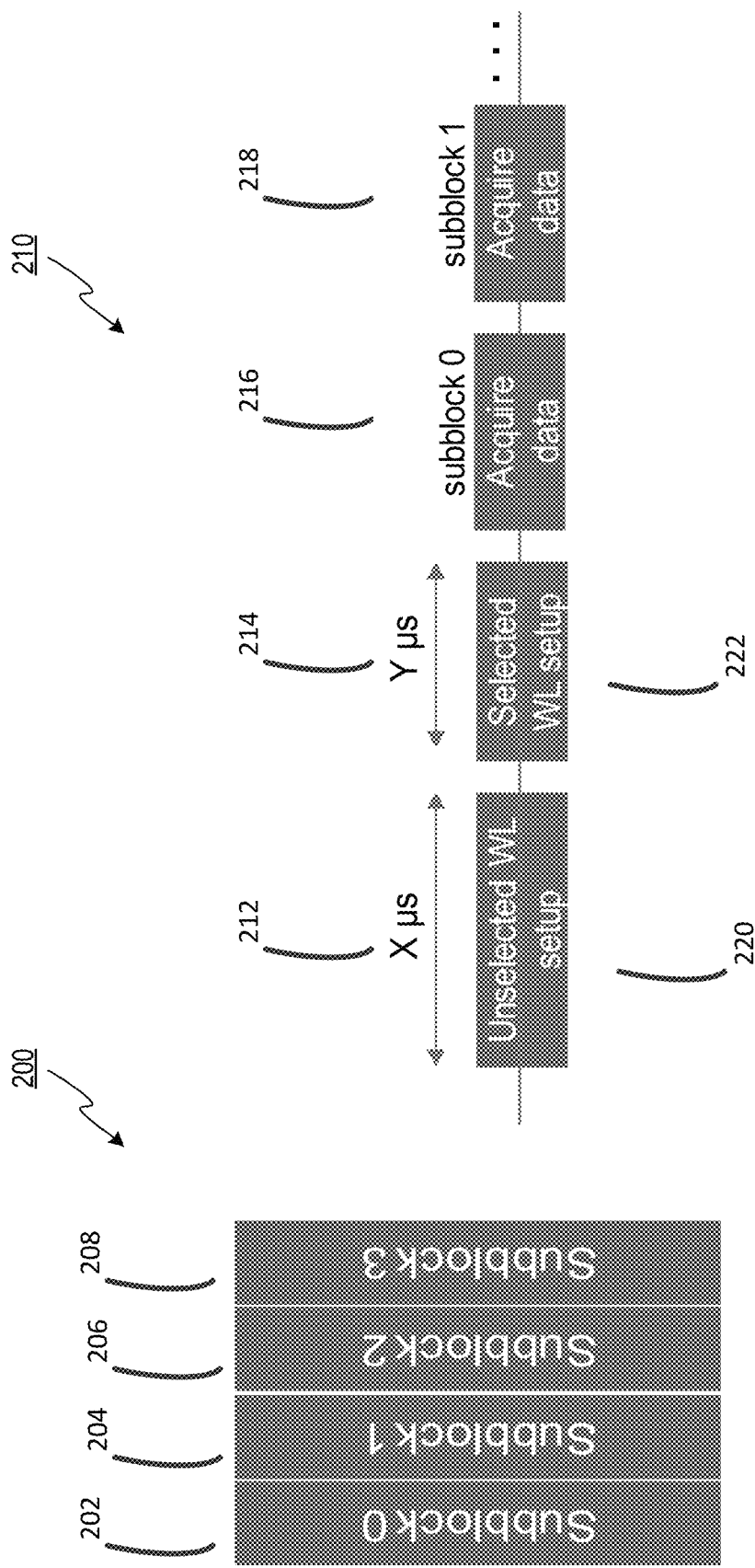
FIG. 2A illustrates an example of a memory component in accordance with some embodiments of the present disclosure.
FIG. 2B illustrates an example of read sequence at a memory component in accordance with some embodiments of the present disclosure.

FIG. 2A illustrates an example of a memory component in accordance with some embodiments of the present disclosure. Data block 200 contains subblock 0 202, subblock 1 204, subblock 2 206, and subblock 3 208, which share the same word line. Thus, when the controller 115 wants to read data at any memory location in subblock 0 202, subblock 1 204, subblock 2 206, and subblock 3 208, the controller 115 can use the same unselected word line (WL) and selected word line (WL) setup sequence. As disclosed above, it is efficient if subblocks sharing the same word line are read in sequential order. Reading subblock 0 202, subblock 1 204, subblock 2 206, and subblock 3 208 in sequential order can mean that the controller 115 reads the subblocks one after another, without any intervening reading of another subblock that does not share the same word line (e.g., reading subblock 0,1,2,3; 1,2,3,0; 3,1,0,2, etc.). In another example, subblock 0 202, subblock 1 204, subblock 2 206, and subblock 3 208 may share the same unselected bit line (BL) and selected bit line (BL) setup sequence.

FIG. 2B illustrates an example of a read sequence at a memory component in accordance with some embodiments of the present disclosure. Read operation 210 shows how subblock 0 202 and subblock 1 204 can be read sequentially. The controller 115 can perform one unselected word line setup 220 and one selected word line setup 222 in order to acquire data 216 from subblock 0 202 and acquire data 218 from subblock 1 204. The unselected word line setup 220 takes a given amount of time 212 (e.g., X µs) and the selected word line setup 222 takes a given amount of time 214 (e.g., Y µs). Without the read optimization component 113, if another read command for a subblock associated with a different word line were received by the controller 115 in between the reception of the read command for subblock 0 202 and the read command for subblock 1 204, then the controller 115 would initiate a separate unselected word line setup and selected word line setup to read subblock 1 204. The present disclosure presents methods and systems for reordering the execution of read commands as to limit the amount of unselected word line setups and selected word line setups needed to read data at the physical memory addresses in a read command queue.

Figure 3:
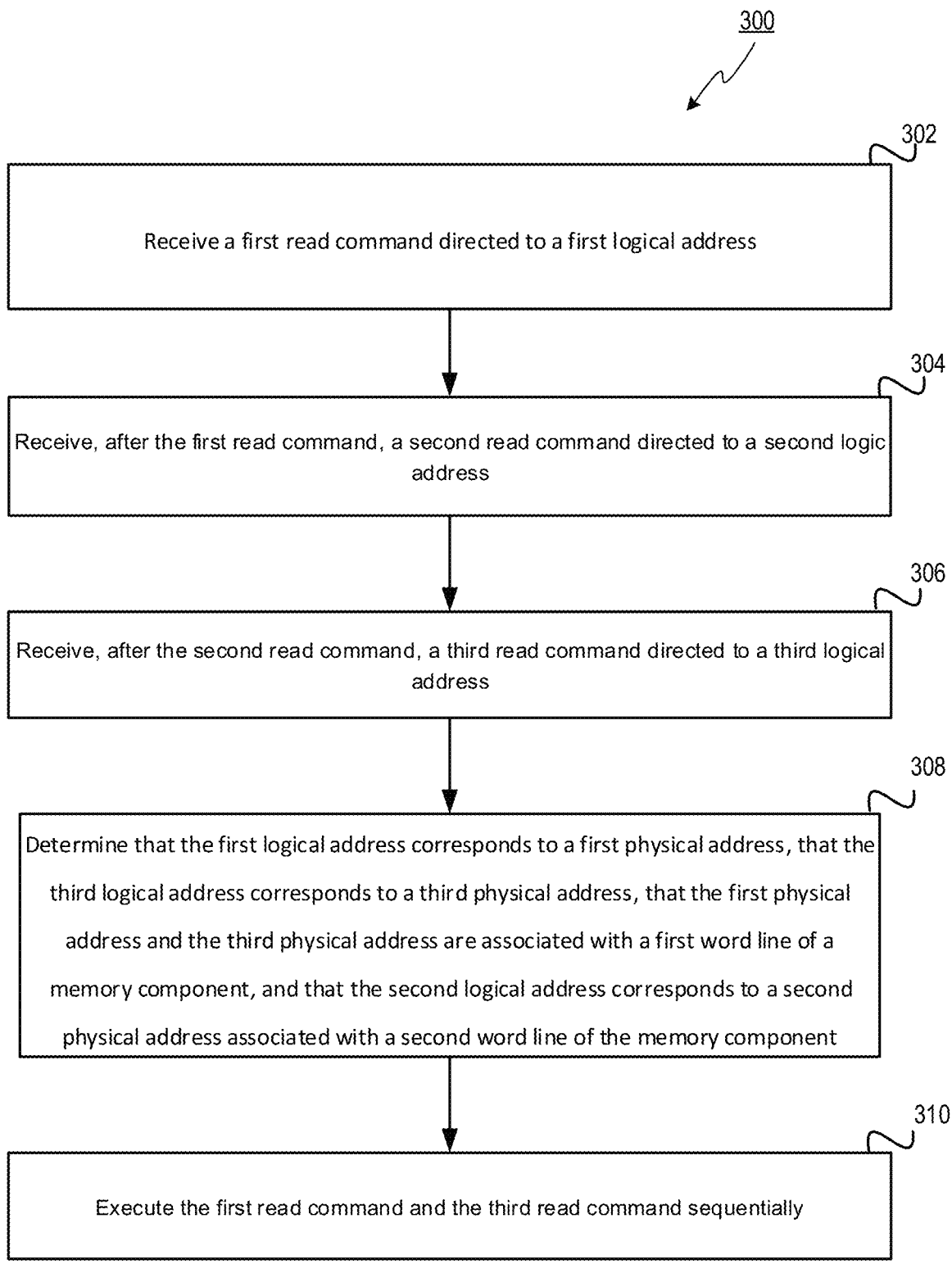
FIG. 3 is a flow diagram of an example method of executing read commands at a memory component of a memory sub-system using read optimization in accordance with some embodiments of the present disclosure.

FIG. 3 is a flow diagram of an example method of executing read commands at a memory component of a memory sub-system using read optimization in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the read optimization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 302, the processing device can receive a first read command directed to a first logical address. The processing device (e.g., the controller 115) can receive the first read command directed to the logical address from the host system 120. The host system 120 can send the read command to the controller 115 in order to obtain the data at a first physical address associated with the first logical address. The read command can be sent based on the request of program running in the host system 120.

At block 304, the processing device can receive, after the first read command, a second read command directed to a second logic address. The host system 120 can send the controller 115 a second read command in order to obtain the data at a second physical address associated with the second logical address.

At block 306, the processing device can receive, after the second read command, a third read command directed to a third logical address. The host system 120 can send the controller 115 third read command in order to obtain the data at a third physical address associated with the third logical address.

At block 308, the processing device can determine that the first logical address corresponds to a first physical address, that the third logical address corresponds to a third physical address, that the first physical address and the third physical address are associated with a first word line of a memory component, and that the second logical address corresponds to a second physical address associated with a second word line of the memory component. The read optimization component 113 can identify that the first physical address associated with the first logical address and the third physical address associated with the third logical address are associated with the same physical location (e.g., word line, bit line, etc.). In this example, the first physical address associated with the first logical address and the third physical address associated with the third logical address share a word line. The read optimization component 113 can perform an analysis to determine whether to reorder the execution of the read commands. For example, if the controller 115 receives the third read command within a given close time from receiving the first read command or if the third read command is close in an execution queue to the first read command, the read optimization component 113 can reorder the commands. However, if the controller 115 receives the third read command within a given distant time from receiving the first read command or if the third read command is far away in the execution queue to the first read command, the read optimization component 113 can opt to execute the commands on a first-come, first-served basis and not reorder the commands.

At block 310, the processing device can execute the first read command and the third read command sequentially (e.g., right after another). In order to reduce the amount of unselected word line setups and selected word line setups, the read optimization component 113 can execute the unselected word line setup and selected word line setup for both the first read command and the third read command and read the data at the first physical address and the third physical address. The controller 115 can then perform another unselected word line setup and selected word line setup to read the data at the second physical address. Alternatively, the controller 115 can read the data at the second physical address, first physical address, and then third physical. Other read sequences are also possible (e.g., third physical, first physical address, second physical address; second physical address, third physical, first physical address). The processing device can execute the first read command and the third read command prior to executing the second read command. The processing device can execute the first read command and the third read command after executing the second read command. Thus, in order to read the data at the three physical addresses, the read optimization component 113 can instruct the controller 115 to perform a total of two unselected word line setups and two selected word line setups. In this example, the read optimization component 113 can save the controller 115 from performing a total of two word line setups. The reduction in unselected word line setups and selected word line setups reduces costs by lowering the amount of time and resources needed to execute read commands. After reading the data at any given physical address, the controller 115 can send the data value to the host system 120.

The controller's 115 unselected word line setup can comprise applying an unselected word line voltage to the unselected word lines. Performing the unselected word line setup operation may comprise applying an unselected word line voltage to one or more word lines not associated with the first physical address and the third physical address. Performing the selected word line setup operation may comprise applying a selected word line voltage to the first word line of the memory component. The controller's 115 selected word line setup can comprise applying a selected word line voltage to the shared word line. In addition, the first physical address can be a first data subblock, the second physical address can be a second data subblock, and the third physical address can be a third data subblock.

Figure 4:
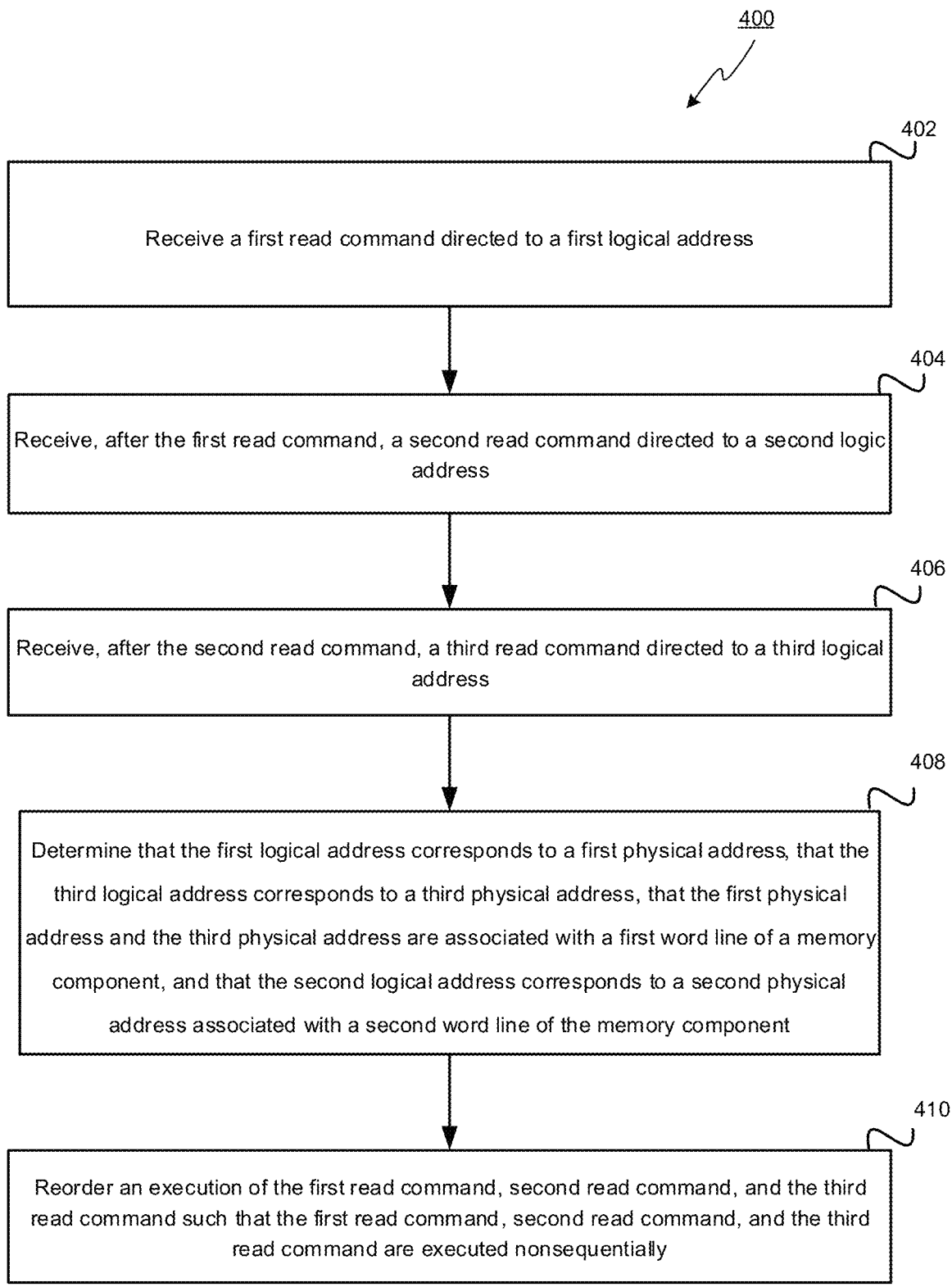
FIG. 4 is a flow diagram of an example method of reading data at a memory component of a memory sub-system using read optimization in accordance with some embodiments of the present disclosure.

FIG. 4 is a flow diagram of an example method 400 of reading data at a memory component of a memory subsystem using read optimization in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the read optimization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 402, the processing device can receive a first read command directed to a first logical address. The processing device (e.g., the controller 115) can receive the first read command directed to the logical address from the host system 120. The host system 120 can send the read command to the controller 115 in order to obtain the data at a first physical address associated with the first logical address.

At block 404, the processing device can receive, after the first read command, a second read command directed to a second logic address. The host system 120 can send the controller 115 second read command in order to obtain the data at a second physical address associated with the second logical address.

At block 406, the processing device can receive, after the second read command, a third read command directed to a third logical address. The host system 120 can send the controller 115 third read command in order to obtain the data at a third physical address associated with the third logical address.

At block 408, the processing device can determine that the first logical address corresponds to a first physical address, that the third logical address corresponds to a third physical address, that the first physical address and the third physical address are associated with a first word line of a memory component, and that the second logical address corresponds to a second physical address associated with a second word line of the memory component. The read optimization component 113 can identify that the first physical address associated with the first logical address and the third physical address associated with the third logical address are associated with the same physical location (e.g., word line, bit line, etc.). In this example, the first physical address associated with the first logical address and the third physical address associated with the third logical address share a word line. The read optimization component 113 can perform an analysis to determine whether to reorder the execution of the read commands. For example, if the controller 115 receives the third read command within a given close time from receiving the first read command or if the third read command is close in an execution queue to the first read command, the read optimization component 113 can reorder the commands. However, if the controller 115 receives the third read command within a given distant time from receiving the first read command or if the third read command is far away in the execution queue to the first read command, the read optimization component 113 can opt to execute the commands on a first-come, first-served basis and not reorder the commands.

At block 410, the processing device can reorder an execution of the first read command, the second read command, and the third read command such that the first read command, the second read command, and the third read command are executed nonsequentially (e.g., not in the order they were received by the controller 115). In order to reduce the amount of unselected word line setups and selected word line setups, the read optimization component 113 can perform the unselected word line setup operation and selected word line setup operation for the first physical address and read the data at the first physical address and the third physical address. The controller 115 can then perform another unselected word line setup and selected word line setup to read the data at the second physical address. Alternatively, the controller 115 can read the data at the second physical address, first physical address, and then third physical. Other read sequences are also possible (e.g., third physical, first physical address, second physical address; second physical address, third physical, first physical address). Thus, in order to read the data at the three physical addresses, the read optimization component 113 can instruct the controller 115 to perform a total of two unselected word line setups and two selected word line setups. In this example, the read optimization component 113 can save the controller 115 from performing a total of two word line setups. The reduction in unselected word line setups and selected word line setups reduces costs by lowering the amount of time and resources needed to execute read commands. After reading the data at any given physical address, the controller 115 can send the data value to the host system 120.

The controller 115's unselected word line setup can comprise applying an unselected word line voltage to the unselected word lines. The controller's 115 selected word line setup can comprise applying a selected word line voltage to the shared word line. In addition, the first physical address can be a first data subblock, the second physical address can be a second data subblock, and the third physical address can be a third data subblock.

Figure 5:
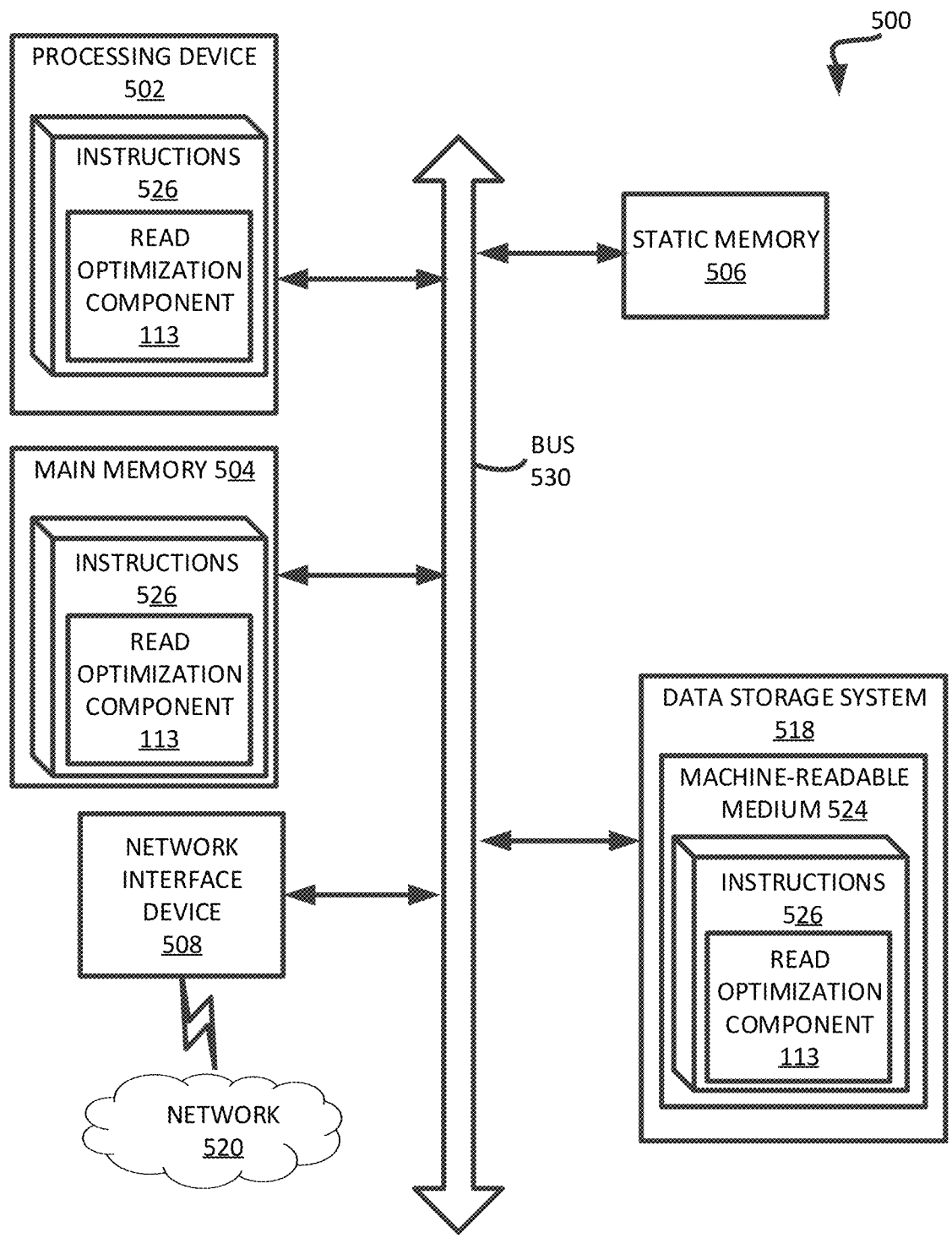
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read optimization component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a read optimization component (e.g., the read optimization component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving a first read command directed to a first logical address;
receiving, after the first read command, a second read command directed to a second logic address;
receiving, after the second read command, a third read command directed to a third logical address;
determining that the first logical address corresponds to a first physical address, that the third logical address corresponds to a third physical address, that the first physical address and the third physical address are associated with a first word line of a memory component, and that the second logical address corresponds to a second physical address associated with a second word line of the memory component; and
executing the first read command and the third read command sequentially.

2. The method of claim 1, wherein executing the first read command and the third read command sequentially comprises executing the first read command and the third read command prior to executing the second read command.

3. The method of claim 1, wherein executing the first read command and the third read command sequentially comprises executing the first read command and the third read command after executing the second read command.

4. The method of claim 1, further comprising:
performing an unselected word line setup operation and a selected word line setup operation for both the first read command and the third read command.

5. The method of claim 4, wherein performing the unselected word line setup operation comprises applying an unselected word line voltage to one or more word lines not associated with the first physical address and the third physical address.

6. The method of claim 4, wherein performing the selected word line setup operation comprises applying a selected word line voltage to the first word line of the memory component.

7. The method of claim 1, wherein the first physical address is a first data subblock, the second physical address is a second data subblock, and the third physical address is a third data subblock.

8. A system comprising:
a memory component; and
a processing device, coupled to the memory component, configured to:
receive a first read command directed to a first logical address;
receive, after the first read command, a second read command directed to a second logic address;
receive, after the second read command, a third read command directed to a third logical address;
determine that the first logical address corresponds to a first physical address, that the third logical address corresponds to a third physical address, that the first physical address and the third physical address are associated with a first word line of a memory component, and that the second logical address corresponds to a second physical address associated with a second word line of the memory component; and
execute the first read command and the third read command sequentially.

9. The system of claim 8, wherein when the processing device executes the first read command and the third read command sequentially, the processing device executes the first read command and the third read command prior to executing the second read command.

10. The system of claim 8, wherein when the processing device executes the first read command and the third read command sequentially, the processing device executes the first read command and the third read command after executing the second read command.

11. The system of claim 8, wherein the processing device performs an unselected word line setup operation and a selected word line setup operation for both the first read command and the third read command.

12. The system of claim 11, wherein performing the unselected word line setup operation comprises applying an unselected word line voltage to one or more word lines not associated with the first physical address and the third physical address.

13. The system of claim 11, wherein performing the selected word line setup operation comprises applying a selected word line voltage to the first word line of the memory component.

14. The system of claim 8, wherein the first physical address is a first data subblock, the second physical address is a second data subblock, and the third physical address is a third data subblock.

15. A non-transitory computer-readable storage medium comprising instructions that, when executed by a processing device, cause the processing device to:
  receive a first read command directed to a first logical address;
  receive, after the first read command, a second read command directed to a second logic address;
  receive, after the second read command, a third read command directed to a third logical address;
  determine that the first logical address corresponds to a first physical address, that the third logical address corresponds to a third physical address, that the first physical address and the third physical address are associated with a first word line of a memory component, and that the second logical address corresponds to a second physical address associated with a second word line of the memory component; and
  reorder an execution of the first read command, the second read command, and the third read command such that the first read command, the second read command, and the third read command are executed nonsequentially.

16. The non-transitory computer-readable storage medium of claim 15, wherein when the processing device executes the first read command, the second read command, and the third read command nonsequentially, the processing device executes the first read command and the third read command prior to executing the second read command.

17. The non-transitory computer-readable storage medium of claim 15, wherein when the processing device executes the first read command, the second read command, and the third read command nonsequentially, the processing device executes the first read command and the third read command after executing the second read command.

18. The non-transitory computer-readable storage medium of claim 15, wherein the processing device performs an unselected word line setup operation and a selected word line setup operation for both the first read command and the third read command.

19. The non-transitory computer-readable storage medium of claim 18, wherein performing the unselected word line setup operation comprises applying an unselected word line voltage to one or more word lines not associated with the first physical address and the third physical address.

20. The non-transitory computer-readable storage medium of claim 18, wherein performing the selected word line setup operation comprises applying a selected word line voltage to the first word line of the memory component.

* * * * *